United States Patent [19]

Yeom

[11] Patent Number: 5,386,199
[45] Date of Patent: Jan. 31, 1995

[54] COMPRESSOR CAPABLE OF COMPRESSING LARGE INPUT SIGNAL WITH MINIMAL DISTORTION

[75] Inventor: Hee-cheol Yeom, Kyungki-do, Rep. of Korea

[73] Assignee: Samsung Electronics Co., Ltd., Kyungki-do, Rep. of Korea

[21] Appl. No.: 217,900

[22] Filed: Mar. 25, 1994

[30] Foreign Application Priority Data

Mar. 25, 1993 [KR] Rep. of Korea ............... 93-4670

[51] Int. Cl.⁶ ............................................. H03G 7/08
[52] U.S. Cl. ...................................... 330/279; 330/140; 327/306; 327/309; 327/317
[58] Field of Search ............... 307/494, 540, 546, 555; 330/140, 279; 333/14

[56] References Cited

U.S. PATENT DOCUMENTS

| | | | |
|---|---|---|---|
| 3,550,028 | 12/1970 | Dilley et al. | 330/140 X |
| 4,754,230 | 6/1988 | Schwartz et al. | 333/14 X |
| 5,079,517 | 1/1992 | Bader | 330/140 X |

*Primary Examiner*—Steven Mottola
*Attorney, Agent, or Firm*—Robert A. Westerlund; Stephen R. Whitt; Charles R. Donohoe

[57] ABSTRACT

A compressor which is capable of compressing an input signal having an extremely large magnitude, without the signal being distorted and without the necessity of a additional circuit element such as an automatic level controller external thereto. The compressor includes a summing amplifier, a full-wave rectifier, an active limiter, and a gain controller. The summing amplifier compresses an input signal and produces a compressed output signal which is a compressed version of the input signal. The full-wave rectifier full-wave rectifies the compressed output signal and converts the rectified compressed output signal to a DC voltage output, and converts the DC voltage output to a first DC output. The active limiter compares the DC voltage output with a prescribed limit voltage, and is only enabled when the DC voltage output is greater than the limit voltage to produce a second DC output which is proportional to the difference between the DC voltage output and the limit voltage.

17 Claims, 3 Drawing Sheets

COMPRESSOR CAPABLE OF COMPRESSING LARGE INPUT SIGNAL WITH MINIMAL DISTORTION

BACKGROUND OF THE INVENTION

The present invention relates generally to a compressor, and more particularly, to a compressor in which distortion of the output signal thereof is minimized.

In a communication system, a compressor is utilized to compress the amplitude of an input signal to be transmitted over a communication or transmission channel, in order to ensure that the amplitude of the signal does not surpass the linear operation range of the transmission channel. The compressor non-linearly compresses the input signal by reducing the degree that relatively small amplitude portions of the signal are compressed and increasing the degree that relatively large amplitude portions of the signal are compressed. The compressor also inherently restricts the extension of the sidebands of the transmitted signal, thereby minimizing cross-talk between adjacent communication channels in both the transmitter and receiver. The communication system also includes an expander, which serves to expand the amplitude of the compressed signal to its original level.

A compandor is an apparatus which includes both a compressor and an expander, and which functions to improve the signal-to-noise (S/N) ratio of a signal transmitted over a noisy transmission channel, by compressing the signal at the transmitter prior to noise exposure, and then expanding the compressed signal back to its original form at the receiver, after noise exposure. The compandor compensates for signal level differences between high volume level sound and low volume level sound, e.g., in telephone systems and the like, wherein high volume level sound is linearly attenuated by the compressor in the transmitter and linearly expanded by the expander in the receiver to its original level.

With reference now to FIG. 1, there can be seen a block diagram of a conventional compressor, which includes a summing amplifier 12, a rectifier 14, a gain controller 16, and an amplitude limiter 18, interconnected as shown.

The summing amplifier 12 compresses an input signal S1 to a predetermined amplitude, to thereby output a compressed signal S2. The rectifier 14 full-wave rectifies the compressed signal S2 to a direct voltage, and then converts the direct voltage into a direct current. The gain controller 16, in response to the output voltage of the summing amplifier 12 and the direct current output of the rectifier 14, exponentially increases or decreases the amplitude of the input signal S1 applied to the input of the summing amplifier 12. The direct current output from the rectifier 14 is proportional to the amplitude of the compressed signal S2.

When the amplitude of the input signal S1 is relatively large, the summing amplifier 12 increases the degree of compression relative to when the amplitude of the input signal S1 is relatively small. The amplitude limiter 18 prevents the compressed signal S2 output from the summing amplifier 12 from being overmodulated, and outputs the signal S3 to a transmitter (not shown) or automatic level controller (not shown).

With reference now to FIGS. 2A and 2B, there can be seen waveforms of the above-described signals produced by the conventional compressor depicted in FIG. 1. More particularly, FIG. 2A illustrates the waveforms of the compressor signals when the amplitude of the input signal S1 is smaller than a first predetermined threshold magnitude, wherein the compressed signal S2 has an amplitude smaller than the saturation or peak level S4 of the amplitude limiter 18. Therefore, the compressed signal S2 is not distorted, and thus, the transmitted signal S3 output by the compressor is also undistorted.

FIG. 2B illustrates the waveforms of the compressor signals when the amplitude of the input signal S1 is greater than the first predetermined threshold magnitude, wherein the compressed signal S2 has an amplitude greater tan S4. Consequently, the amplitude limiter clips the portion of the compressed signal S2 which is greater than S4, thereby distorting the compressed signal S2, and hence, the transmitted signal S3.

In order to eliminate the above-described type of output signal distorted, the compressor is designed to reduce the degree of compression of the input signal S1 when the input signal S1 has a relatively small amplitude, and to increase the degree of compression of the input signal S1 when the input signal S1 has a relatively large amplitude. In this way, as long as the amplitude of the input signal S1 is not greater than a second predetermined threshold magnitude above which the compressed signal S2 is clipped by the amplitude limiter 18 at the level S4, the signal-to-noise (S/N) ratio of the compressed signal S2, and hence, the transmitted signal S3, is enhanced.

However, when the amplitude of the input signal S1 exceeds the second predetermined threshold magnitude, the amplitude of the compressed signal S2 will still exceed the peak level S4 of the amplitude limiter 18, whereby the portion of the compressed signal S2 greater than S4 is clipped by the amplitude limiter 18, thereby distorting both the compressed signal S2 and the transmitted (output) signal S3.

In order to overcome the above-described distortion problem, an automatic level controller (not shown) is added to the conventional compressor to prevent the amplitude limiter 18 from clipping the compressed signal S2 when its amplitude exceeds the second predetermined threshold magnitude. Because the capacitors of the automatic level controller must necessarily be large, they can not be fully integrated with the core circuity of the compressor on a single chip, and thus, must be provided as a peripheral device external to the core circuity of the compressor. Of course, this increases the number of components and manufacturing costs of the conventional compressor.

Based on the above and foregoing, it can be appreciated that there presently exists a need in the art for a compressor which eliminates the above-described drawbacks and shortcomings of presently available compressors. The present invention fulfills this need.

SUMMARY OF THE INVENTION

The present invention encompasses a compressor which is capable of compressing an input signal having an extremely large magnitude, without the signal being distorted and without the necessity of a additional circuit element such as an automatic level controller external thereto. The compressor includes a summing amplifier, a full-wave rectifier, an active limiter, and a gain controller. The summing amplifier compresses an input signal and produces a compressed output signal which is a compressed version of the input signal. The full-wave rectifier full-wave rectifies the compressed output signal and converts the rectified compressed output signal to a DC voltage output, and converts the DC voltage output to a first DC output. The active limiter compares the DC voltage output with a prescribed limit voltage, and is only enabled when the DC voltage output is greater than the limit voltage to produce a second DC output which is proportional to the difference between the DC voltage output and the limit voltage. In a preferred embodiment, the active limiter is a specially configured differential amplifier. The gain controller receives, at a first input, the sum of the first and second DC outputs, and, at a second input, the compressed output signal, and produces a gain control signal in response thereto. The gain control signal is combined with the input signal to thereby increase or decrease the amplitude of the input signal by an amount dependent upon the amplitude of the compressed output signal. In a preferred embodiment, the gain controller exponentially increases or decreases the gain control signal in response to decreases or increases, respectively, of the amplitude of the compressed output signal. The compressor also preferably includes an amplitude limiter for preventing overmodulation of the compressed output signal prior to transmission thereof.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and, in which.

DETAILED DESCRIPTION OF THE INVENTION

Figure 1:
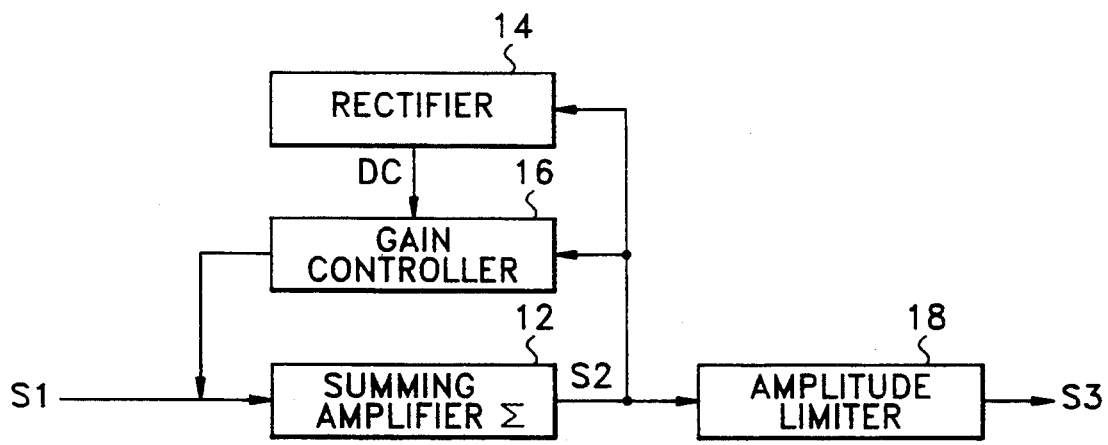
FIG. 1 is a block diagram of a conventional compressor.
Figure 2A:
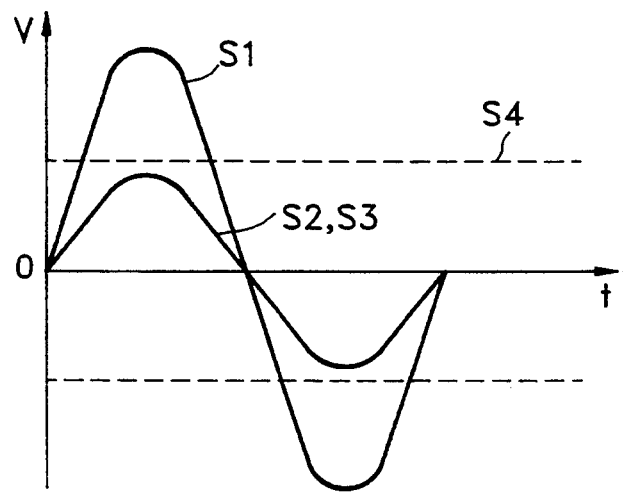
FIGS. 2A and 2B are waveform diagrams of signals produced by the conventional compressor depicted in FIG. 1.
Figure 2B:
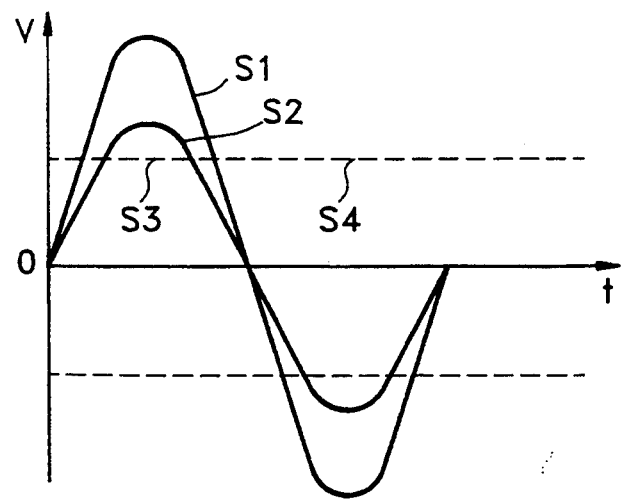
Figure 3:
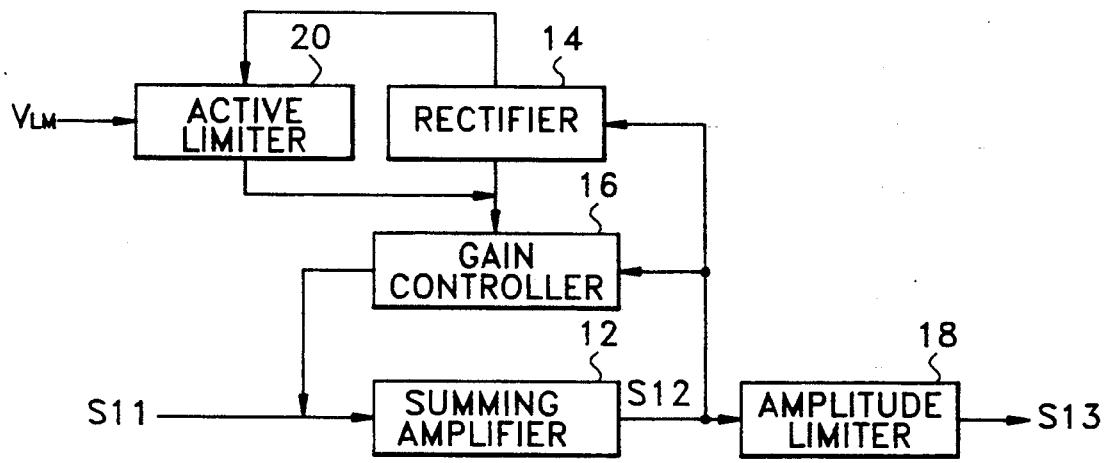
FIG. 3 is a block diagram of a compressor constructed in accordance with a preferred embodiment of the present invention.
Figure 4:
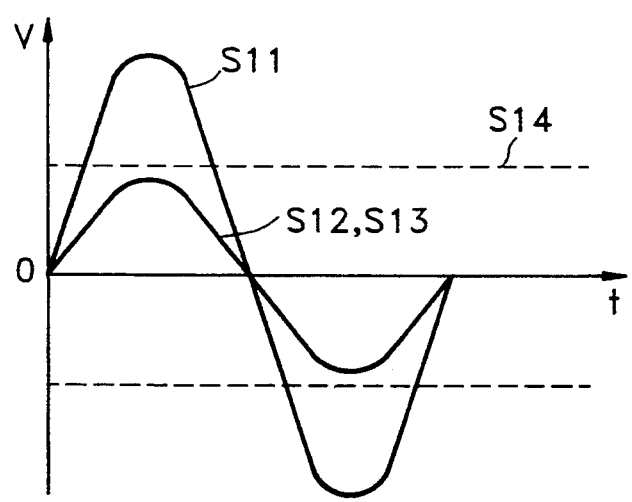
FIG. 4 is a waveform diagram of signals produced by the compressor of the present invention depicted in FIG. 3; and, FIG. 5 is a schematic diagram of the active limiter circuit of the compressor the present invention depicted in FIG. 3.

With reference now to FIG. 3, there can be seen a block diagram of a compressor constructed in accordance with a preferred embodiment of the present invention. More particularly, the compressor of the present invention includes an additional circuit element, an active limiter 20, not found in the conventional compressor depicted in FIG. 1. As will become more clear from the more detailed description which follows, the active limiter 20 compares the rectified DC voltage output of a rectifier 14 with an externally input limit voltage, $V_{LM}$, and operates only when the rectified DC voltage output of the rectifier 14 is greater than the limit voltage, which only occurs when the amplitude of an input signal S11 is greater than a predetermined threshold value.

The compressor of the present invention also includes a summing amplifier 12, a gain controller 16, and an amplitude limiter 18, interconnected with the active limiter 20 and the rectifier 14 as shown in FIG. 3.

In operation, the summing amplifier 12 functions to compress an input signal S11 applied to an input port thereof by an amount which varies as a function of the amplitude of the input signal S11, to thereby produce an output signal S12 which is a compressed version of the input signal S11. The compressed signal S12 is applied to a first input of the rectifier 14.

The rectifier 14 functions to full-wave rectify the compressed signal S12, to thereby produce a DC voltage at a first output thereof. The DC voltage, which is a full-wave rectified version of the compressed signal S12, is applied to a first input of the active limiter 20. The rectifier 14 also functions to convert the DC voltage to a direct current, to thereby produce a direct current (DC) output at a second output thereof. The DC output, which is also proportional to the amplitude of the compressed signal S12, is applied to a first input of the gain controller 16.

The active limiter 20, in addition to receiving the DC voltage output of the rectifier 14 at a first input thereof, receives an externally supplied limit voltage $V_{LM}$ at a second input thereof. The active limiter 20 is only enabled to produce an active output when the DC voltage received from the rectifier 14 is greater than the limit voltage. If the DC voltage received from the rectifier 14 is less than or equal to the limit voltage, the active limiter 20 is not enabled. When the rectifier 14 is enabled, it functions to produce a direct current (DC) output which is proportional to the difference between the DC voltage received from the rectifier 14 and the limit voltage. The DC output of the active limiter 20 is also applied to the first input of the gain controller 16, along with the DC output of the rectifier 14.

The gain controller 16 thus receives the sum of the DC outputs of the active limiter 20 and the rectifier 14 at a first input thereof. The gain controller 16 also receives the compressed signal S12 at a second input thereof. The gain controller 16 functions to compare the DC sum received at its first input with the compressed signal S12 received at its second input, to thereby produce an output signal which is combined or summed with the input signal S11. The gain controller 16 is designed to exponentially reduce the amplitude of the input signal S11 as the amplitude of the compressed signal S12 increases, to thereby increase the degree by which the summing amplifier 12 compresses the input signal S11 when the amplitude of the compressed signal S12 increases, and conversely, to exponentially increase the amplitude of the input signal S11 as the amplitude of the compressed signal S12 decreases, to thereby decrease the degree by which the summing amplifier 12 compresses the input signal S11 when the amplitude of the compressed signal S12 decreases. In this way, the gain controller 16 causes the summing amplifier 12 to increase the degree of compression when the amplitude of the input signal S11 is relatively large, and to decrease the degree of compression when the amplitude of the input signal S11 is relatively small.

Figure 5:
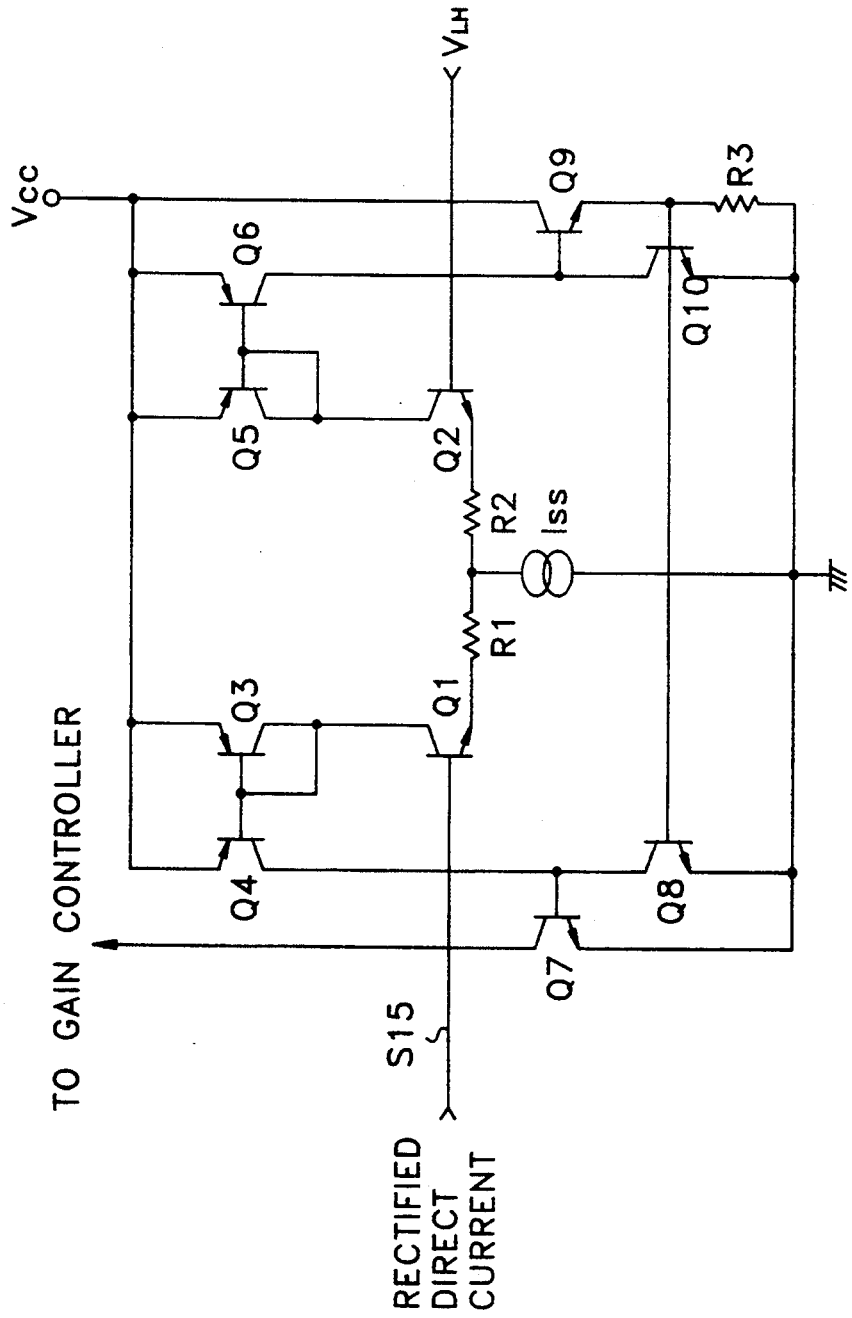

With reference now to FIG. 5, there can be seen a circuit schematic of a presently preferred implementation of the active limiter 20. The active limiter 20 includes bipolar transistors Q1 and Q2 whose base electrodes are coupled to the DC voltage output of the rectifier 14 and the limit voltage, $V_{LM}$, respectively. The collector electrode of the transistor Q1 is commonly coupled to the base and collector electrodes of a bipolar transistor Q3, whose emitter electrode is connected to a power source voltage $V_{cc}$. The collector electrode of the transistor Q2 is commonly coupled to the base and collector electrodes of a bipolar transistor Q5, whose emitter electrode is also connected to the power source voltage $V_{cc}$. The base electrode of the transistor Q3 is connected to the base electrode of a bipolar transistor Q4, whose emitter electrode is also connected to the power source voltage $V_{cc}$. The transistors Q3 and Q4 form a first current mirror. The base electrode of the transistor Q5 is connected to the base electrode of a bipolar transistor Q6, whose emitter electrode is also connected to the power source voltage $V_{cc}$. The transistors Q5 and Q6 form a second current mirror. The emitter electrodes of the transistors Q1 ad Q2 are coupled together through series-connected resistors R1 and R2. A constant current source $I_{SS}$ is connected between a common node intermediate the resistors R1 and R2, and ground.

With continuing reference to FIG. 5, the active limiter 20 further includes a bipolar transistor Q8 whose collecto electrode is connected to the collector electrode of the transistor Q4, and a bipolar transistor Q10 whose collector electrode is connected to the collector electrode of the transistor Q6. The emitter electrodes of the transistors Q8 and Q10 are both connected to ground. The collector electrode of the transistor Q8 is also connected to the base electrode of a bipolar transistor Q7, whose emitter electrode is connected to ground and whose collector electrode is coupled to the first input of the gain controller 16. The collector electrode of the transistor Q10 is also connected to the base electrode of a bipolar transistor Q9, whose collector electrode is connected to the power source voltage $V_{cc}$, and whose emitter electrode is coupled to ground through a resistor R3. The emitter electrode of the transistor Q9 is also commonly coupled to the base electrodes of the transistors Q10 and Q8.

With continuing reference to FIG. 5, the active limiter 20 operates as follows. More particularly, if the externally supplied limit voltage $V_{LM}$ is greater than the DC voltage output from the rectifier 14, the collector current of the transistor Q1 becomes smaller than that of the transistor Q2, which causes the collector current of the transistor Q6 to become greater than that of the transistor Q1, thus turning on the transistor Q9, which results in the turning on of the transistors Q8 and Q10. In this state, no base current is applied to the transistor Q7, which therefore is turned off. Consequently, the DC current output from the active limiter 20 (via the transistor Q7) to gain controller 16 is not varied (i.e., not active).

On the other hand, if the DC voltage output from the rectifier 14 is greater than the externally supplied limit voltage $V_{LM}$, the collector current of the transistor Q1 becomes greater than the collector current of the transistor Q2, which causes the collector current of the transistor Q6 to become smaller than that of the transistor Q4, thus turning off the transistor Q9. This, in turn, causes the collector current of the transistor Q8 to become smaller than that of the transistor Q1. In this state, since current is supplied to the base electrode of the transistor Q7, the collector current of the transistor Q7 is increased, with the result that the active limiter 20 supplies a direct current output to the gain controller 16 (via the transistor Q7) which is proportional to the difference between the limit voltage $V_{LM}$ and the DC voltage output from the rectifier 14.

Based on the above and foregoing, it can be appreciated that the compressor of the present invention can compress an input signal having an extremely large magnitude, without the signal being distorted and without the necessity of an additional circuit element such as an automatic level controller external thereto. Further, although the present invention has been described in detail hereinabove, it should be clearly understood than many variations and/or modifications of the basic inventive concepts herein taught which may appear to those skilled in the pertinent art will still fall within the spirit and scope of the present invention as defined in the appended claims.

What is claimed is:

1. A compressor, comprising:
   means for compressing an input signal and for producing a compressed output signal which is a compressed version of said input signal;
   means for full-wave rectifying said compressed output signal and for converting said rectified compressed output signal to a direct current voltage output and for converting said direct current voltage output to a first direct current output;
   active limiter means for comparing said direct current voltage output with a prescribed limit voltage, said active limiter means being enabled when said direct current voltage output is greater than said prescribed limit voltage to produce a second direct current output proportional to the difference between said direct current voltage output and said prescribed limit voltage; and,
   gain controller means for receiving, at a first input, the sum of said first and second direct current outputs, and, at a second input, said compressed output signal, and for producing a gain control signal in response thereto, said gain control signal being combined with said signal to thereby increase or decrease the amplitude of said input signal by an amount dependent upon the amplitude of said compressed output signal.

2. The compressor as set forth in claim 1, wherein said compressing means comprises a summing amplifier.

3. The compressor as set forth in claim 2, wherein:
   said gain controller means includes means for comparing said sum with said compressed output signal; and, said gain control signal is non-linearly proportional to the difference between said sum and said compressed output signal.

4. The compressor as set forth in claim 1, wherein said gain controller means exponentially decreases said gain control signal in response to increases of the amplitude of said compressed output signal, and to exponentially increase said gain control signal in response to decreases of the amplitude of said compressed output signal.

5. The compressor as set forth in claim 1, wherein said active limiter means comprises a differential amplifier.

6. The compressor as set forth in claim 5, wherein said differential amplifier comprises:
   a first bipolar transistor having a base electrode coupled to said direct current voltage output;
   a second bipolar transistor having a base electrode coupled to said limit voltage;
   a third bipolar transistor having a collector electrode and a base electrode commonly connected to a collector electrode of said first bipolar transistor, and an emitter electrode connected to a source voltage;

a fourth bipolar transistor having a collector electrode and a base electrode commonly connected to said collector electrode of said second bipolar transistor, and an emitter electrode connected to said source voltage;

a fifth bipolar transistor having a base electrode connected to said base electrode of said third bipolar transistor, and an emitter electrode connected to said source voltage, wherein said third and fifth bipolar transistors form a first current mirror;

a sixth bipolar transistor having a base electrode connected to said base electrode of said fourth bipolar transistor, and an emitter electrode connected to said source voltage, wherein said fourth and sixth transistors form a second current mirror;

first and second resistors serially connected between emitter electrodes of said first and second bipolar transistors;

a constant current source connected between a common node between said first and second resistors, and ground;

a seventh bipolar transistor having a collector electrode connected to a collector electrode of said fifth bipolar transistor, and an emitter electrode connected to ground;

an eighth bipolar transistor having a collector electrode connected to a collector electrode of said sixth bipolar transistor; and an emitter electrode connected to ground;

a ninth bipolar transistor having a collector electrode connected to said source voltage, a base electrode connected to said collector electrodes of said sixth and eighth bipolar transistors, and an emitter electrode connected to said base electrodes of said seventh and eighth bipolar transistors;

a third resistor connected at one end thereof to said emitter electrodes of said seventh and ninth bipolar transistors, and at an opposite end thereof to ground, and, a tenth bipolar transistor having a base electrode connected to said collector electrodes of said fifth and seventh bipolar transistors, an emitter electrode connected to ground, and a collector electrode coupled to said first input of said gain controller means.

7. The compressor as set fort in claim 1, wherein said active limiter means comprises:
a differential amplifier having a first input for receiving said direct current voltage output, and a second input for receiving said limit voltage, said differential amplifier being configured to produce an active output signal when said direct current voltage output is greater than said limit voltage; and,
means responsive to said active output signal for generating said second direct current output.

8. The compressor as set forth in claim 7, wherein said means responsive to said active output signal comprises a bipolar transistor.

9. The compressor as set forth in claim 1, further comprising amplitude limiter means for receiving said compressed output signal and for producing a transmission output signal, said amplitude limiter means being configured to prevent overmodulation of said compressed signal output.

10. A compressor, comprising:

a summing amplifier for compressing an input signal and for producing a compressed output signal which is a compressed version of said input signal;

a full-wave rectifier for full-wave rectifying said compressed output signal and for converting said rectified compressed output signal to a direct current voltage output and for converting said direct current voltage output to a first direct current output;

an active limiter for comparing said direct current voltage output with a prescribed limit voltage, said active limiter means being enabled when said direct current voltage output is greater than said prescribed limit voltage to produce a second direct current output proportional to the difference between said direct current voltage output and said prescribed limit voltage; and, a gain controller for receiving, at a first input, the sum of said first and second direct current outputs, and, at a second input, said compressed output signal, and for producing a gain control signal in response thereto, said gain control signal being combined with said input signal to thereby increase or decrease the amplitude of said input signal by an amount dependent upon the amplitude of said compressed output signal.

11. The compressor as set forth in claim 10, wherein:
said gain controller includes means for comparing said sum with said compressed output signal; and,
said gain control signal is non-linearly proportional to the difference between said sum and said compressed output signal.

12. The compressor as set forth in claim 10, wherein said gain controller exponentially decreases said gain control signal in response to increases of the amplitude of said compressed output signal, and to exponentially increase said gain control signal in response to decreases of the amplitude of said compressed output signal.

13. The compressor as set forth in claim 10, wherein said active limiter comprises a differential amplifier.

14. The compressor as set forth in claim 13, wherein said differential amplifier comprises:
a first bipolar transistor having a base electrode coupled to said direct current voltage output;
a second bipolar transistor having a base electrode coupled to said limit voltage;
a third bipolar transistor having a collector electrode and a base electrode commonly connected to a collector electrode of said first bipolar transistor, and an emitter electrode connected to a source voltage;
a fourth bipolar transistor having a collector electrode and a base electrode commonly connected to said collector electrode of said second bipolar transistor, and an emitter electrode connected to said source voltage;
a fifth bipolar transistor having a base electrode connected to said base electrode of said third bipolar transistor, and an emitter electrode connected to said source voltage, wherein said third and fifth bipolar transistors form a first current mirror;
a sixth bipolar transistor having a base electrode connected to said base electrode of said fourth bipolar transistor, and an emitter electrode connected to said source voltage, wherein said fourth and sixth transistors form a second current mirror;

first and second resistors serially connected between emitter electrodes of said first and second bipolar transistors;

a constant current source connected between a common node between said first and second resistors, and ground;

a seventh bipolar transistor having a collector electrode connected to a collector electrode of said fifth bipolar transistor, and an emitter electrode connected to ground;

an eighth bipolar transistor having a collector electrode connected to a collector electrode of said sixth bipolar transistor; and an emitter electrode connected to ground;

a ninth bipolar transistor having a collector electrode connected to said source voltage, a base electrode connected to said collector electrodes of said sixth and eighth bipolar transistors, and an emitter electrode connected to said base electrodes of said seventh and eighth bipolar transistors;

a third resistor connected at one end thereof to said emitter electrodes of said seventh and ninth bipolar transistors, and at an opposite end thereof to ground, and, a tenth bipolar transistor having a base electrode connected to said collector electrodes of said fifth and seventh bipolar transistors, an emitter electrode connected to ground, and a collector electrode coupled to said first input of said gain controller means.

15. The compressor as set forth in claim 10, wherein said active limiter comprises:

a differential amplifier having a first input for receiving said direct current voltage output, and a second input for receiving said limit voltage, said differential amplifier being configured to produce an active output signal when said direct current voltage output is greater than said limit voltage; and, means responsive to said active output signal for generating said second direct current output.

16. The compressor as set forth in claim 15, wherein said means responsive to said active output signal comprises a bipolar transistor.

17. The compressor as set forth in claim 10, further comprising an amplitude limiter for receiving said compressed output signal and for producing a transmission output signal, said amplitude limiter being configured to prevent overmodulation of said compressed signal output.

* * * * *